(12) United States Patent
Gerlach et al.

(10) Patent No.: US 12,015,240 B2
(45) Date of Patent: Jun. 18, 2024

(54) LASER DEVICE AND METHOD OF DETERMINING A MALFUNCTION OF A LASER DIODE

(71) Applicants: TRUMPF Photonic Components GmbH, Ulm (DE); Robert Bosch GmbH, Stuttgart (DE)

(72) Inventors: Philipp Henning Gerlach, Ulm (DE); Susanne Weidenfeld, Weilheim (DE); Robert Wolf, Dresden (DE); Soren Sofke, Tuebingen (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 519 days.

(21) Appl. No.: 17/313,014

(22) Filed: May 6, 2021

(65) Prior Publication Data

US 2021/0273399 A1 Sep. 2, 2021

Related U.S. Application Data

(63) Continuation of application No. PCT/EP2019/080642, filed on Nov. 8, 2019.

(30) Foreign Application Priority Data

Nov. 8, 2018 (EP) .................................. 18205097

(51) Int. Cl.
*G01J 1/42* (2006.01)
*H01S 5/00* (2006.01)
(Continued)

(52) U.S. Cl.
CPC .......... *H01S 5/0021* (2013.01); *G01J 1/4257* (2013.01); *H01S 5/0264* (2013.01); *H01S 5/183* (2013.01)

(58) Field of Classification Search
CPC .. H01S 5/0021; H01S 5/0264; H01S 5/06812; H01S 5/06825; H01S 5/183; H01S 5/423; G01J 1/4257
(Continued)

(56) References Cited

U.S. PATENT DOCUMENTS 5,019,769 A * 5/1991 Levinson ............... H01S 5/0683
372/38.1
5,757,837 A * 5/1998 Lim ...................... H01S 5/0264
372/98
(Continued)

FOREIGN PATENT DOCUMENTS

WO WO-9800893 A1 * 1/1998 ......... H01S 5/06213

OTHER PUBLICATIONS

Grabherr, et al., "Integrated Photodiodes Complement the VCSEL Platform," *Proceedings of the SPIE*, 7229, pp. 72290E-1-72290E-9, Feb. 19, 2009, The International Society for Optical Engineering, Bellingham, Washington, USA.

*Primary Examiner* — Jeffrey P Aiello
(74) *Attorney, Agent, or Firm* — LEYDIG VOIT & MAYER LTD.

(57) ABSTRACT

A laser device includes a laser diode configured to emit radiation, an output power of the radiation being dependent on a laser diode driving current, and a photodiode configured to receive the radiation emitted by the laser diode. A photodiode current induced in the photodiode by the received radiation is dependent on a power of the received radiation. The laser device further includes circuitry configured to measure the photodiode current for a laser diode driving current and calculate a laser threshold current of the laser diode from the measured photodiode current as a measure of an actual laser threshold current of the laser
(Continued)

diode. The circuitry is further configured to detect a malfunction or degradation of the laser diode.

13 Claims, 5 Drawing Sheets

(51) Int. Cl.
*H01S 5/026* (2006.01)
*H01S 5/183* (2006.01)

(58) Field of Classification Search
USPC ....... 340/10.1; 702/130, 182, 183, 188, 189,
702/35, 40, 85, 159, 118, 58, 127
See application file for complete search history.

(56) References Cited

U.S. PATENT DOCUMENTS

| | | | |
|---|---|---|---|
| 6,483,862 B1 | 11/2002 | Aronson et al. | |
| 2004/0032894 A1* | 2/2004 | Pitman | H01S 5/0021 |
| | | | 372/50.1 |
| 2005/0094695 A1 | 5/2005 | Trezza et al. | |
| 2007/0116076 A1 | 5/2007 | Wang et al. | |
| 2009/0237622 A1 | 9/2009 | Nishioka et al. | |
| 2013/0135420 A1* | 5/2013 | Kawano | B41J 2/442 |
| | | | 347/224 |
| 2013/0287418 A1* | 10/2013 | Akagi | G03G 15/043 |
| | | | 399/51 |
| 2014/0270752 A1 | 9/2014 | Onaka | |
| 2015/0161926 A1 | 6/2015 | Ogi et al. | |

* cited by examiner

LASER DEVICE AND METHOD OF DETERMINING A MALFUNCTION OF A LASER DIODE

CROSS REFERENCE TO RELATED APPLICATIONS

This application is a continuation of International Application No. PCT/EP2019/080642 (WO 2020/094826 A1), filed on Nov. 8, 2019, and claims benefit to European Patent Application No. EP 18205097.1, filed on Nov. 8, 2018. The aforementioned applications are hereby incorporated by reference herein.

FIELD

The present disclosure relates to laser devices. More specifically, the present disclosure relates to laser devices comprising one or more laser diodes. In particular, the laser diode or laser diodes are of the type of Vertical Cavity Surface Emitting Lasers (VCSELs). Further, the present disclosure relates to a method of determining malfunctions of a laser diode.

BACKGROUND

Laser devices based on laser diodes, in particular laser diodes of the type of VCSELs, are attractive for optical sensing applications. VCSELs with integrated photodiodes (VIPs) are even more attractive components as they provide a light source and detector in one package. Optical sensing applications using laser devices based on VCSELs with integrated photodiode (VIPs) are, for example, sensing of particles, sensing of distance, sensing of velocity, etc. Laser devices based on VCSELs are advantageous due to low cost, low power consumption, high sensitivity, small footprint, self-aligned optical path, etc.

Output power of a laser diode may decrease due to degradation of the laser diode over lifetime. Thus, power monitoring of the output of the laser diode is crucial for many applications that rely on fixed optical power levels.

In conventional VCSELs, it is normally not possible to monitor the amount of light that is generated. This means that it is not possible to detect the situation that a VCSEL would fail early in the life due to for example, semiconductor (e.g. GaAs) defects, facet etching or mechanical damage of the VCSEL. Typical early fail rates of VCSELs are in the range of 500 ppm. This rate is too high for most optical sensors, which have to specify an infant fail rate of typically <100 ppm. The output power of laser light generated by a VCSEL may be monitored by a photodetector arranged in a housing common with but external to the VCSEL. However, using an external photodetector requires more space leading to less compact optical sensors. It would therefore be advantageous to integrate a photodiode into the VCSEL chip which should allow to measure the light output actually emitted by the VCSEL, wherein the measurement could be used as feedback loop to adjust the VCSEL driving current. However, it has been found that it is not trivial to integrate a monitor photodiode into a VCSEL chip, as such an integrated (internal) photodiode is usually not only sensitive to laser light emission, but to spontaneous light emission of the VCSEL. Spontaneous light emission (also referred to as LED light emission) might become more if laser light emitted by the VCSEL becomes less.

In an article by M. Grabherr et al.: "Integrated photodiodes complement the VCSEL platform", in Vertical-Cavity Surface-Emitting Lasers XIII, edited by Kent D. Choquette, Chun Lei, Proc. of SPIE Vol. 7229, 72290E, 2009 it is described how a VCSEL may be designed with an integrated photodiode such that the internal photodiode is more sensitive to laser light than to LED light. As comes out from this article, it is, due to design constraints, difficult to make an internal photodiode such that the increase of the photodiode current with laser light output power is at least a factor of 2 higher than the increase of the photodiode current with LED light output power. Thus, monitoring the output power of a laser diode with an integrated photodiode seems to be not reliable.

US 2014/0270752 A1 discloses an optical transmitting device including a laser diode to which a first or second driving current is provided. A controller provides the laser diode with the first driving current to transmit an optical signal and with a plurality of second driving currents, to emit light, different from each other in magnitude during a stop of providing the first driving current. A measuring unit measures an intensity of the light emitted by the laser diode. A calculator calculates a threshold current of the laser diode, based on the intensities corresponding to the plurality of second driving currents measured by the measuring unit and magnitudes of the plurality of second driving currents. A determination unit determines a precursor of a sudden-death of the laser diode, based on an amount of variation in the threshold current calculated by the calculator during a specific period.

US 2013/0287418 A1 discloses a light beam scanning device which is capable of performing high-accuracy light amount control. The device includes a laser diode.

US 2007/0116076 A1 discloses methods, apparatus and systems to achieve substantially constant optical power and/or extinction ratio for a semiconductor laser.

U.S. Pat. No. 5,019,769 A discloses a laser diode controller using a programmed microcontroller to accurately control the process of turning on and selecting the operating point of the laser diode.

U.S. Pat. No. 5,757,837 discloses a vertical-cavity surface emitting laser with an intracavity quantum well photodetector.

Thus, there still is a need for a laser device the output power of which can be monitored in a more reliable manner, in order to detect a malfunction or degradation of the laser diode.

SUMMARY

In an embodiment, the present disclosure provides a laser device including a laser diode configured to emit radiation, an output power of the radiation being dependent on a laser diode driving current, and a photodiode configured to receive the radiation emitted by the laser diode. A photodiode current induced in the photodiode by the received radiation is dependent on a power of the received radiation. The laser device further includes circuitry configured to measure the photodiode current for a laser diode driving current and calculate a laser threshold current of the laser diode from the measured photodiode current as a measure of an actual laser threshold current of the laser diode. The circuitry is configured to measure a first photodiode current for a first laser diode driving current at which the laser diode is in a non-lasing operation, calculate a first linear slope from the measured first photodiode current, measure a second photodiode current for a second laser diode driving current at which the laser diode is in a lasing operation, and calculate a second linear slope from the measured second photodiode current. The circuitry is configured to calculate the laser threshold current as the laser diode current, at which the first and second linear slopes intersect, determine a ratio of the gradient of the second linear slope to the gradient of the first linear slope, and detect a malfunction or degradation of the laser diode when the ratio is equal to or lower than a threshold.

BRIEF DESCRIPTION OF THE DRAWINGS

Subject matter of the present disclosure will be described in even greater detail below based on the exemplary figures. The invention defined by the following claims is not limited to the exemplary embodiments. All features described and/or illustrated herein can be used alone or combined in different combinations. The features and advantages of various embodiments will become apparent by reading the following detailed description with reference to the attached drawings, which illustrate the following:

DETAILED DESCRIPTION

The present disclosure provides a laser device having at least one laser diode, a malfunction of which may be detected in a more reliable manner.

The present disclosure provides a laser device having at least one laser diode, the degradation over a lifetime of which can be monitored in a more reliable manner.

The present disclosure provides an improved method of monitoring a laser diode in order to detect malfunctions or degradation of the laser diode.

In a first aspect of the present disclosure, a laser device is provided, comprising: at least one laser diode configured to emit radiation, with an output power of the radiation depending on a laser diode driving current, a photodiode configured to receive the radiation emitted by the at least one laser diode, wherein the received radiation induces a photodiode current in the photodiode in dependence on the output power of the received radiation, and circuitry configured to measure the photodiode current for a laser diode driving current, and determine a calculated laser threshold current of the at least one laser diode from the measured photodiode current as a measure of an actual laser threshold current of the at least one laser diode. The circuitry is configured to measure a first photodiode current for a first laser diode driving current at which the at least one laser diode is in a non-lasing operation, to calculate a first linear slope from the measured first photodiode current, to measure a second photodiode current for a second laser diode driving current at which the at least one laser diode is in a lasing operation, to calculate a second linear slope from the measured second photodiode current, and to determine the calculated laser threshold current as the laser diode current, at which the first and second linear slopes intersect. The circuitry is further configured to determine a ratio of the gradient of the second linear slope to the gradient of the first linear slope. The circuitry is further configured to detect a malfunction or degradation of the at least one laser diode, if the ratio is equal to or lower than a threshold.

The present disclosure provides a concept for how a monitor photodiode can be reliably used for monitoring the quality state of a laser diode without measuring the actual output power of the laser diode. The concept of the present disclosure is particularly advantageous for, but not limited to, a laser device having at least one laser diode with integrated photodiode (VIP), although such a design may suffer from a relatively high sensitivity of the integrated photodiode to LED light in comparison with the sensitivity of the integrated photodiode to laser light. The concept is based on determining, for example calculating, a virtual laser threshold current of the at least one laser diode from the photodiode current measured for a laser diode driving current at one or more measuring points. The determined virtual laser threshold current is not necessarily exactly the actual laser threshold current of the laser diode, but may serve as a reliable indicator of the actual laser threshold current. The calculated laser threshold current (which will also be referred to as "virtual" or "alternative" laser threshold current in the present description) gives a good insight into the quality state of the at least one laser diode. Directly measuring the actually emitted output power of the laser diode is therefore no longer necessary. The circuitry may be integrated in the laser diode chip, or may be circuitry external to the laser diode chip. For example, the circuitry may be an ASIC, or the function of the circuitry may be implemented in an ASIC that drives and controls the at least one laser diode.

In the present description, the term "laser diode" encompasses one light emitting element or light emitting part, such as a mesa of a VCSEL. Two or more laser diodes (two or more mesas) may be arranged on a common chip. For example, in case of VCSELs, two mesas on a common chip are denoted as two VCSELs in the present description.

The number of measuring points (laser diode driving currents), at which the photodiode current is measured, may be as low as 1, but can also include a larger number of measurement points, e.g. 2, 3, 4 or more. Preferably, the number of measuring points is kept as low as possible to reduce the computational expenditure.

The circuitry may be configured to detect a malfunction or degradation of the at least one laser diode based on the determined alternative laser threshold current.

Thus, detection of a malfunction or degradation of the at least one laser diode may be based on a single determined parameter without requiring measuring the actual output power of the laser diode.

The circuitry may be configured to determine the alternative laser threshold current as the laser diode driving current at which the photodiode current as function of the laser diode driving current exhibits a kink.

Although it may be the case as described in the above-referenced article that the photodiode current increase with laser light output power may not be substantially higher than the sensitivity of the photodiode to LED light, a kink may be nevertheless present in the photodiode current curve. This kink is at or close to the actual laser diode threshold current. Therefore, the kink can be advantageously used for determining the alternative laser threshold current. If no or only a weak kink is detectable, a malfunction of the at least one laser diode is likely.

The circuitry is configured to measure the photodiode current for a laser diode driving current at which the laser diode is in a non-lasing operation, and to calculate a linear slope from the measured photodiode current.

An advantage here is that by e.g. two or a small number of measurements the linear slope of the photodiode current as a function of the laser diode driving current in the non-lasing state of the at least one laser diode can be calculated. The computational expenditure is advantageously reduced in this embodiment.

If a linear slope of the photodiode current is calculated as described before, or if the linear slope below laser threshold is known, the circuitry may be configured to incrementally increase the laser diode driving current, to measure the photodiode current for the incrementally increased laser diode driving current, and to determine the alternative laser threshold current as the laser diode driving current at which the measured photodiode current deviates from the linear slope by more than a threshold.

In this embodiment, an iterative algorithm may be used to find the kink in the photodiode current signal. When the laser diode driving current is incrementally increased below the actual laser threshold current, the associated measured photodiode current will be situated more or less exactly on a linear slope. When the laser diode driving current reaches and slightly exceeds the actual laser threshold current, the laser diode commences lasing operation, and the associated photodiode current will no longer be situated on the linear slope, but more distinctly deviate therefrom. The laser diode driving current at which the associated photodiode current distinctly deviates from the linear slope, may then be determined as the alternative laser threshold current. The incremental steps of increasing the laser diode driving current must not be very small, but small enough to detect the kink in the photodiode current signal, so that the alternative laser threshold current may be determined with high speed and low computational expenditure.

The circuitry is configured to measure the photodiode current for a laser diode driving current at which the laser diode is in a lasing operation, and to calculate a linear slope from the measured photodiode current.

It might turn out that the linear slope of the photodiode current below the laser threshold current is not changing much and does not need to be measured repeatedly. In this case, it would be sufficient to measure the photodiode current as function of the laser diode driving current at one or more measurement points above the actual laser threshold, while the photodiode current below the laser threshold current is measured much less frequently or is even not measured.

The circuitry is configured to measure a first photodiode current for a first laser diode driving current at which the laser diode is in a non-lasing operation, to calculate a first linear slope from the measured first photodiode current, to measure a second photodiode current for a second laser diode driving current at which the laser diode is in a lasing operation, to calculate a second linear slope from the measured second photodiode current, and to determine the alternative laser threshold current as the laser diode current, at which the first and second linear slopes intersect.

This measure is advantageous, because with e.g. a little number of measurement points, two linear slopes can be calculated, and the alternative laser threshold current can be determined as the laser diode driving current at the intersection of the two linear slopes.

In the above configurations, the linear slope above the laser threshold current could also be calculated based on a known modulated signal in the laser driving current during sensing mode, instead of using measurements at a number of laser diode driving currents above the laser threshold.

The circuitry is further configured to determine a ratio of the gradient of the second linear slope to the gradient of the first linear slope.

This measure is advantageous so as to have a verification, whether the measurements of the photodiode currents are reliable. If the ratio of the gradients of the second and first linear slopes is equal to or lower than 1, this indicates that the laser diode exhibits a malfunction.

In this regard, the circuitry is configured to detect a malfunction of the at least one laser diode, if the ratio is equal to or lower than a threshold. This threshold is larger than 1, e.g. may be 1.5, or may be larger than 2, e.g. 2.5.

The circuitry may be configured to detect a malfunction or degradation of the at least one laser diode, when the determined alternative laser threshold current exceeds a predetermined limit.

The predetermined limit may be a value of the alternative laser threshold current, which is so far away from the nominal laser threshold current specified for the at least one laser diode that the laser diode cannot be used for the sensing application in question.

The at least one laser diode preferentially is a vertical cavity surface emitting laser (VCSEL).

The photodiode and the at least one laser diode may be arranged on a common chip, or the photodiode maybe integrated in the at least one laser diode and arranged external to an optical resonator of the laser diode, or the photodiode may be integrated in the at least one laser diode and arranged internal to an optical resonator of the laser diode.

It is particularly advantageous if the photodiode is integrated in the laser diode, be it in the optical resonator or external to the optical resonator of the laser diode. As mentioned above, in case of a photodiode integrated in a VCSEL, the sensitivity of the photodiode to LED light emitted by the VCSEL might be too high which problem is resolved by determining an alternative laser threshold current of the at least one laser diode.

In a further embodiment, the at least one laser diode is a first laser diode, and the laser device further comprises at least one second laser diode, wherein the photodiode is configured to receive the radiation emitted by the first laser diode and the radiation emitted by the at least one second laser diode.

In this embodiment, one photodiode can measure the light emission of at least two laser diodes. The at least two laser diodes may be integrated on a common chip. The photodiode may be integrated into the at least two laser diodes. The at least two photodiodes may be at least two VCSELs. The photodiode may be integrated to the VCSELs internal to the resonator cavities or external to the resonator cavities of the VCSELs. The light emitting structures of the VCSELs may be mesas. Thus, with one photodiode, it is possible to detect malfunctions or degradation of a plurality of laser diodes. Measurements of the photodiode current and determination of alternative laser threshold currents of the plurality of laser diodes may be performed in time intervals, individually for each of the laser diodes. The circuitry may be configured to determine alternative threshold currents for the plurality of laser diodes as described above. The circuitry may be configured to select one of the laser diodes which exhibits the best performance in terms of output power for operation in a sensing application to be carried out with the laser device. The circuitry may base the selection on the determined alternative threshold currents determined for the plurality of laser diodes. The laser diode of the plurality of laser diodes with the best performance may be that for which the determined alternative laser threshold current is the lowest one.

According to a second aspect, a method of monitoring an output power of a laser diode is provided, which comprises the steps: providing a photodiode configured to receive radiation emitted by the laser diode, wherein the received radiation induces a photodiode current in the photodiode in dependence on the output power of the received radiation, measuring a first photodiode current for a first laser diode driving current at which the at least one laser diode is in a non-lasing operation, calculating a first linear slope from the measured first photodiode current, measuring a second photodiode current for a second laser diode driving current at which the at least one laser diode is in a lasing operation, calculating a second linear slope from the measured second photodiode current, calculating a laser threshold current, as a measure of an actual laser threshold current of the laser diode, as the laser diode current, at which the first and second linear slopes intersect, determining a ratio of the gradient of the second linear slope to the gradient of the first linear slope, and detecting a malfunction or degradation of the at least one laser diode, if the ratio is equal to or lower than a threshold.

The method has the same or similar embodiments as the laser device.

The method can advantageously be used for detecting a malfunction or degradation of at least one laser diode of a laser device during or after manufacturing same, or in the laser device during operation in, for example, an optical sensing application.

The disclosure also provides a computer program which comprises program code means for causing a computer to perform the steps of the method disclosed herein when said computer program is carried out on a computer, as well as a non-transitory computer-readable recording medium that stores therein a computer program product, which, when executed by a processor, causes the method disclosed herein to be performed.

Figure 1:
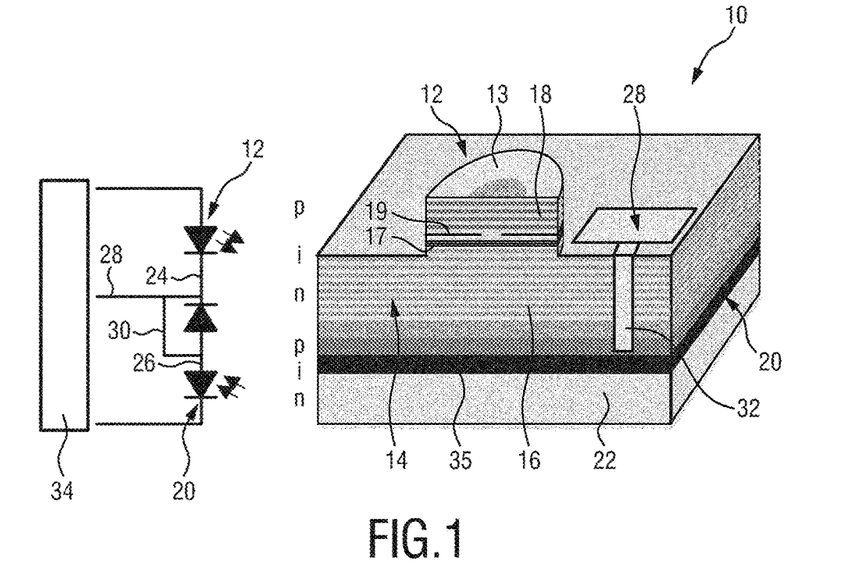
FIG. 1 shows, in the right part, an embodiment of a laser device comprising a laser diode with integrated photodiode in a schematic cross-section and, in the left part, a connection scheme of the electrical connection between the laser diode and the photodiode.

FIG. 1 shows an embodiment of a laser device 10. The laser device 10 may be used in an optical sensing application, for example in particle detection.

The laser device 10 comprises a laser diode 12. The laser diode 12 may be configured as a Vertical Cavity Surface Emitting Laser (VCSEL). The VCSEL may have a mesa structure 13 as known in the art. The VCSEL may be configured to have an optical resonator cavity 14 including a lower distributed Bragg reflector (DBR) 16 and an upper DBR 18. The reflectors 16 and 18 form the optical resonator cavity 14 of the laser diode 12. A laser active quantum well layer 17 and a current confinement layer 19 may be arranged between the lower and upper DBRs as known in the art.

The laser device 10 further comprises a photodiode 20. In this embodiment, the photodiode 20 is integrated into the laser diode 12 between the lower DBR and a substrate 22. Thus, the photodiode is external to the resonator cavity 14. The photodiode 20 may have a p-i-n structure. The electrical connection of a cathode 24 of the laser diode 12 and an anode 26 of the photodiode 20 is accomplished by an intra-resonator cavity n-contact 28 of the laser diode 12 and a via contact 30 to a p-doped layer of the photodiode 20 and an electroplated metal pillar 32 connecting both electrodes. Thus, the cathode 24 of the laser diode 12 is shorted to the anode of the photodiode 20 in this embodiment. The p-doped layer of the photodiode 20 may be 3 μm thick, for example. An absorption layer 35 of the photodiode 20 may consist of undoped GaAs and may be 2 μm thick, for example.

In the left part of FIG. 1, the connection scheme between the laser diode 12 and the photodiode 20 is shown.

In the embodiment of FIG. 1, the laser diode 12, here configured as a VCSEL, may be grown on top of the p-i-n photodiode 20.

The laser device 10 further comprises circuitry 34 configured to control the laser diode 12 and the photodiode 20. The circuitry 34 may be configured to measure the photodiode current of the photodiode 20 induced by radiation emitted by the laser diode 12 and received by the photodiode 20.

In operation, the laser diode 12 emits radiation, wherein an output power of the radiation depends on the laser diode driving current driving the laser diode 12. The photodiode 20 receives the radiation emitted by the laser diode 12 which in the present embodiment is absorbed by the i-layer 35 of the photodiode 20. The radiation emitted by the laser diode 12 and received by the photodiode 20 induces a photodiode current in the photodiode in dependence on the output power of the radiation emitted by the laser diode 12 and received by the photodiode 20.

Figure 2:
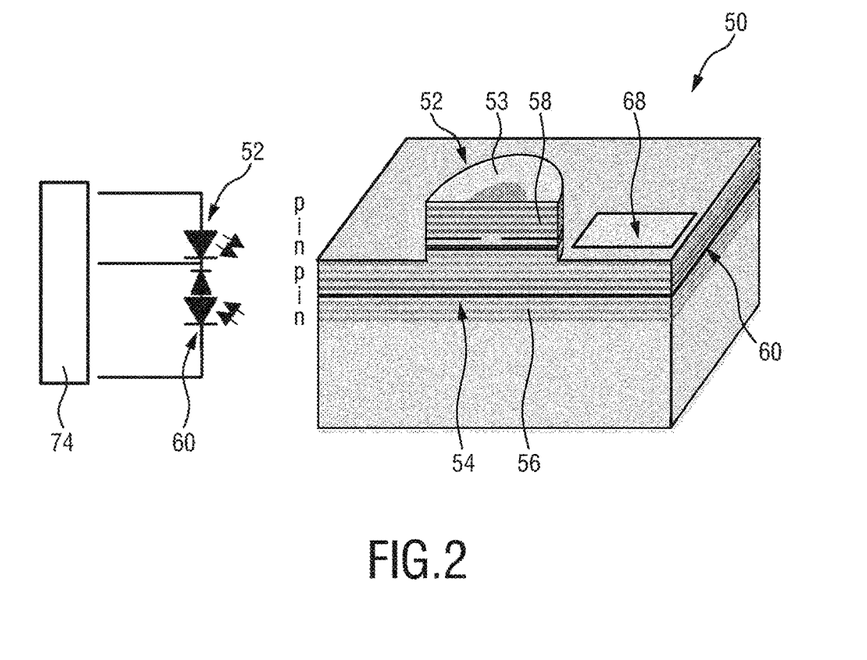
FIG. 2 shows, in the right part, another embodiment of a laser device comprising a laser diode with integrated photodiode in a schematic cross-section and, in the left part, a connection scheme of the electrical connection between the laser diode and the photodiode.

FIG. 2 shows another embodiment of a laser device 50 comprising a laser diode 52. The laser device 50 further comprises a photodiode 60 which is integrated into the laser diode 52. Differently from the embodiment in FIG. 1, the photodiode 60 is integrated in the optical resonator cavity 54 of the laser diode 12. In the present embodiment, the photodiode 60 is integrated into a lower DBR of the optical resonator cavity 54 that further includes an upper DBR 58 and a laser active medium having quantum wells between the DBRs. As in the embodiment in FIG. 1, the laser diode 52 may be configured as a VCSEL comprising a mesa structure 53. Integration of the photodiode 60 into the lower DBR 56 may be accomplished as follows. The lower DBR 56 may consist of 3 areas, starting below the laser active medium with n-doped layers, changing to p-doped layers followed by an absorption layer of the photodiode 60 placed around an antinode of the standing wave pattern in order to get maximum responsivity and maximum contrast of stimulated versus spontaneous emission of the laser diode 52. The p-i-n structure of the photodiode is finished by further n-doped layers. An intra-resonator cavity contact 68 in the central n-doped DBR part is used as both, VCSEL cathode and photodiode anode. An additional p-n-junction between the cathode of the laser diode 12 and the anode of the photodiode 60 is not shortened, but driven in forward direction and thus the photodiode anode contact may be skipped.

The laser device 50 includes circuitry 74 configured to control the laser diode 52 and the photodiode 60. The circuitry 74 may be configured to measure the photodiode current of the photodiode 60 induced by radiation emitted by the laser diode 52 and received by the photodiode 60.

Differently from measuring output power of a laser diode with an external photodetector, measuring output power of a laser diode having an integrated photodiode is not straightforward because the integrated photodiode is not only sensitive to stimulated emission of radiation emitted by the laser diode (laser light), but is also sensitive to spontaneous emission of radiation emitted by the laser diode (LED light), as will be explained with reference to FIG. 3.

Figure 3:
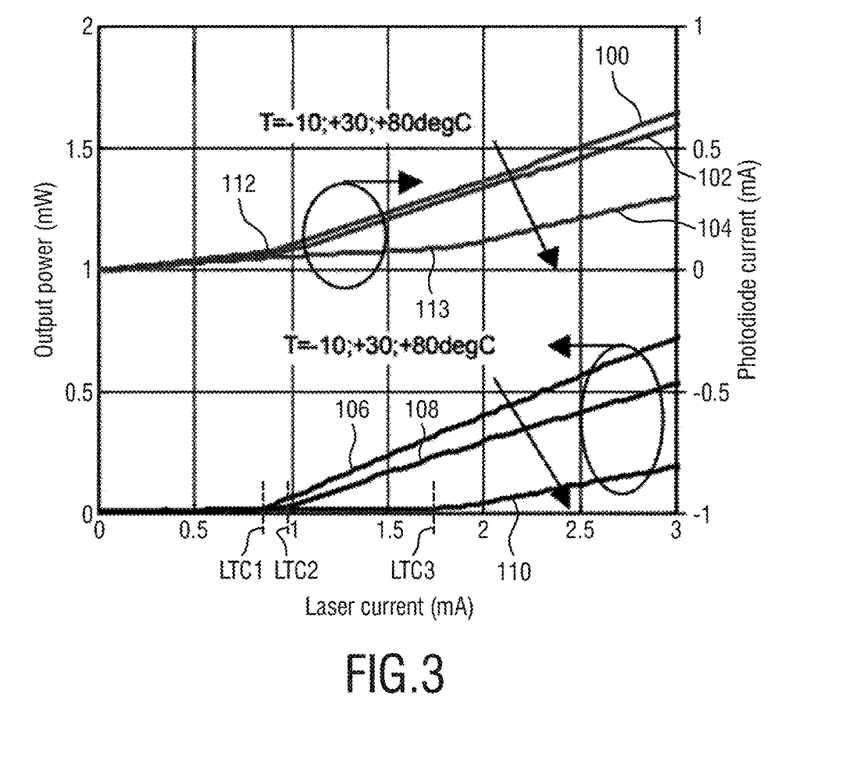
FIG. 3 shows a diagram illustrating output power of a laser diode as function of laser driving current at different temperatures (lower three curves) and photodiode current as function of laser driving current at the different temperatures (upper three curves)

Upper curves 100, 102, 104 in FIG. 3 show the photodiode current induced in a photodiode when receiving radiation from a laser diode in a case, where the photodiode is integrated into the laser diode, for example like in case of laser device 50 in FIG. 2. The photodiode current is shown in FIG. 3 as a function of laser diode driving current for driving the laser diode. Curves 100, 102, 104 refer to the temperatures −10° C., +30° C., and +80° C. in this order. Lower curves 106, 108, 110 in FIG. 3 illustrate the output power of radiation of the laser diode as a function of the laser driving current for the three temperatures −10° C., +30° C., and +80° C. in this order. As can be seen in FIG. 3, the output power of the laser diode below the (temperature dependent) actual laser threshold currents LTC1, LTC2, LTC3 (for the three indicated temperatures) is almost constant and about zero, and noticeably increases, beginning at the laser threshold current, with increasing laser driving current above the laser threshold current. However, already below the actual laser threshold current, the photodiode current increases due to a sensitivity of the integrated photodiode to LED light emitted by the laser diode. As it comes out, the sensitivity of the photodiode current to LED light might be too high so that the photodiode current increase with increasing output power of laser light above the laser threshold current is not such dominant over the sensitivity of the photodiode to LED light that it is difficult to monitor the output power of the laser diode by simply monitoring the photodiode current with an integrated photodiode.

However, what can be clearly seen in the photodiode current curves in FIG. 3 is a kink 112 (approximately the same for the temperatures −10° C. and +30° C.) and a kink 113 (for the temperature +80° C.). What can also be seen in FIG. 3 is that the kinks 112 and 113 approximately correspond to the laser threshold currents LTC1, LTC2, LTC3.

Figure 4:
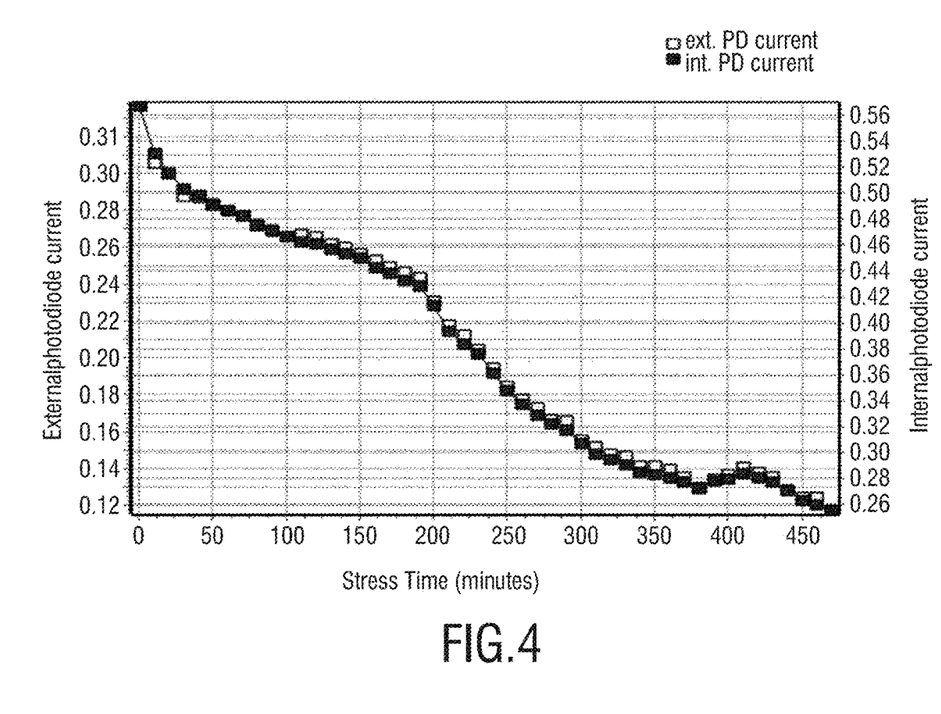
FIG. 4 shows a diagram illustrating the temporal behavior of photodiode current of a photodiode used as an external detector for measuring output power of a laser diode in an accelerated life test, and the temporal behavior of photodiode current of a photodiode integrated into a laser diode in an accelerated life test.

FIG. 4 shows results of an accelerated life test carried out on a VCSEL over about 470 minutes. In the accelerated life test, the degradation behavior of the VCSEL was measured by using a photodiode external to the laser diode and by a photodiode integrated into the laser diode. The white boxes show the measurement results for the measurement of photodiode currents of the external photodiode, and the black boxes show the photodiode currents measured with the integrated photodiode. As comes out from FIG. 4, the VCSEL is degrading as expected, and the photodiode current of the integrated photodiode has quite similar degradation behavior as the measurement of the output power of laser light that is measured with the external (outside) detector. Note that the internal photodiode current is plotted to the right axis and the photodiode current measured with an external detector is plotted to the left axis in FIG. 4. However, based on the diagram of FIG. 4, it may be concluded that the internal photodiode current carries the same or almost the same information regarding degradation and actual life status of a VCSEL like the photodiode current obtained with an external photodiode.

As described above with reference to FIGS. 1 and 2, the circuitry 34 of laser device 10 or the circuitry 74 of the laser device 50 may be configured to measure the photodiode current of the photodiode 20 or 60. In the following, it will be described that these measurements of photodiode currents may be used to calculate a virtual or "alternative" laser threshold current as a measure for the actual or real laser threshold current of a laser diode. The alternative laser threshold current may be used as an indicator of the quality state of the laser diode. The alternative laser threshold current may be used reliably to detect a malfunction or degradation of the laser diode.

Figure 5:
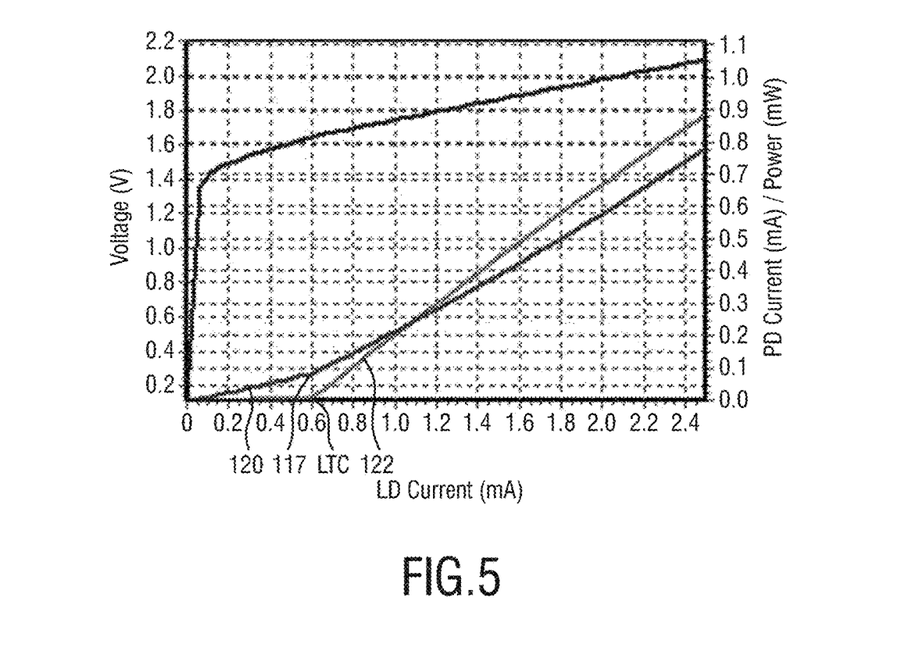
FIG. 5 shows a diagram illustrating photodiode current as function of laser driving current of a laser diode and output power of the laser diode as function of laser diode driving current.

FIG. 5 shows a diagram with a first curve 120 showing an example of photodiode current as function of laser diode driving current, and a second curve 122 shows the output power of the laser diode as a function of laser diode driving current. The photodiode current curve or signal exhibits a kink 117 in good approximation at the actual laser threshold current LTC. The kink 117 may advantageously be used to determine the alternative laser threshold mentioned above. Advantageously, the alternative laser threshold current may be determined as the laser diode driving current at which the photodiode current as function of the laser diode driving current exhibits the kink 117.

In the following, methods of determining the alternative laser threshold from the photodiode current signal as function of the laser diode driving current will be described. A first method to determine the kink and, thus, the alternative laser threshold current, the photodiode current is measured, e.g. by the circuitry 34 or 74 in FIG. 1 or 2, for at least two different laser diode driving currents at which the laser diode is in a non-lasing operation, i.e. below the laser threshold current, and to calculate a linear slope from the measured photodiode currents. For example, the photodiode current may be measured for two laser diode driving currents of 0.1 mA and 0.3 mA. These driving currents are well below the actual laser threshold current which is about 0.5 mA in the example of FIG. 5. From these two measurements, the circuitry 34 or 74 may calculate a linear slope 126 shown in FIG. 6. It is to be understood that the photodiode current may be measured for more than two different laser diode driving currents, which might be advantageous that the linear slope can be calculated more exactly. Two measurement points have the advantage that the calculation effort for calculating the linear slope 126 is reduced.

Figure 6:
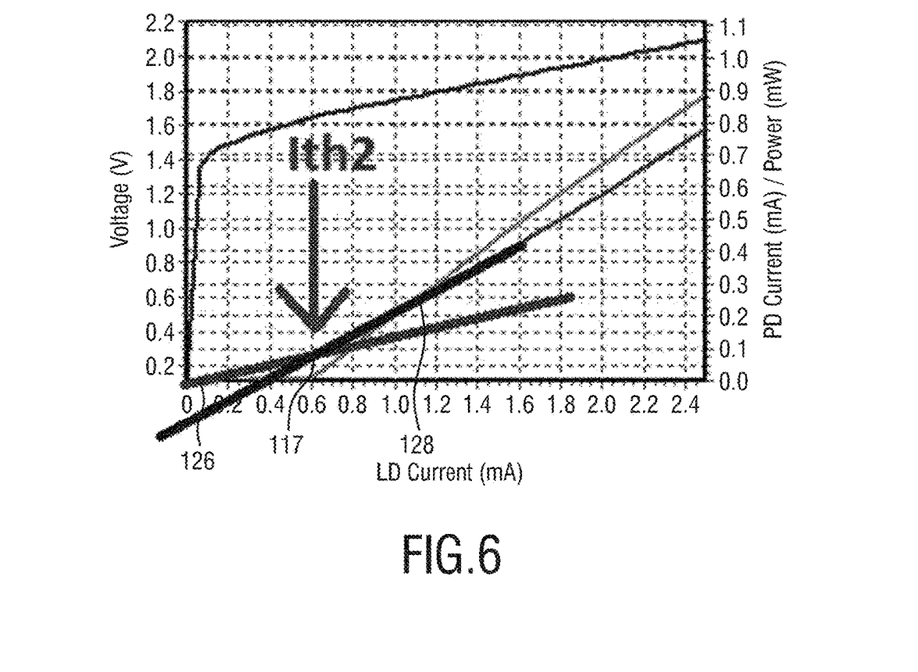
FIG. 6 shows the diagram of FIG. 5 wherein two linear slopes have been drawn into the photodiode current curve for determining a virtual laser threshold current.

The circuitry 34 or 74 may be configured to measure the photodiode current for at least two different laser diode driving currents at which the laser diode is in a lasing operation, i.e. above the laser threshold current, and to calculate a linear slope from these measured photodiode currents. For example, the circuitry may measure the photodiode current at 1.3 mA and 1.5 mA which are well above the actual laser threshold in FIG. 5. The circuitry determines a linear slope 128 from these measurements as shown in FIG. 6. The circuitry may determine or calculate the alternative laser threshold current as the laser diode driving current at which the linear slopes 126 and 128 intersect. The intersection point denoted with Ith2 in FIG. 6 indicates the kink 117 in the photodiode current signal.

Thus, by a small number of four measurements of the photodiode current at four different laser diode driving currents, the alternative laser threshold current Ith2 may be determined or calculated, in this embodiment by calculating two linear slopes from the measurements and determining or calculating their intersection point. The alternative laser threshold Ith 2 may be used as a reliable measure for the actual or real laser threshold current.

Alternative methods for determining the alternative laser threshold Ith2 will be described in the following.

The circuitry 34 or 74 in FIGS. 1 and 2 may use an iterative algorithm to find the kink 117 in the photodiode current signal. This may be performed by first measuring the photodiode current at two laser diode driving currents in order to determine the linear slope 126 as shown in FIG. 6 of the photodiode current below laser threshold current. Then, starting from the (second) measurement of the photodiode current at 0.3 mA in the example above, the circuitry may incrementally increase the laser driving current and measure the photodiode current for the incrementally increased laser diode driving current. For example, the laser diode driving current may be set to e.g. 0.4 mA after the linear slope 126 has been determined by the measurements at e.g. 0.1 mA and e.g. 0.3 mA. The photodiode current is then measured at the laser diode driving current of 0.4 mA. Then, the circuitry determines whether the photodiode current measured at the laser diode driving current of 0.4 mA deviates by a predetermined amount from the linear slope 126, i.e. from the linear prediction given by the linear slope 126. The laser driving current of 0.4 mA is assigned to be the alternative laser threshold current Ith2 if the photodiode current for the laser diode driving current 0.4 mA exceeds the linear slope 126 by the predetermined amount, and the iterative algorithm is finished here. In case that the measured photodiode current at the laser diode driving current of 0.4 mA is determined to be on the linear slope 126 or only deviates therefrom by an amount less than the predetermined amount, then the circuitry incrementally increases the laser diode driving current to e.g. 0.5 mA, measures the associated photodiode current and determines whether the measured photodiode current deviates from the linear slope 126 by the predetermined amount, etc. It is to be noted that the incremental increase of the laser diode driving current may be different from 0.1 mA.

Another possible way which makes use of the determination of two linear slopes like linear slopes 126, 128 is to measure the photodiode current to calculate the linear slope 128 above the laser threshold current more frequently than the photodiode current to calculate the linear slope 126 below the laser threshold current. The reason is that it might turn out that the linear slope below the laser threshold current is not changing much and does not need to be measured repeatedly. This way of determining Ith2 simplifies calculation of the intersection of the two linear slopes 126, 128.

Another way to determine the linear slope 128 may be based on a known modulated signal in the laser driving current to measure the linear slope 128 above the laser threshold current during sensor mode of the laser device 10 or 50, instead of using two measuring points above the laser threshold current, like the measuring points at 1.3 mA and 1.5 mA.

In further embodiments, the circuitry 34 or 74 may be configured to determine a ratio of the gradient of the second linear slope 128 to the gradient of the first linear slope 126. This ratio of the gradients of the linear slopes 126, 128 may be used to detect a malfunction or degradation of the laser diode, if the ratio is equal to or lower than a threshold which is a hint that there is no or almost no kink in the photodiode current curve. The threshold may be a number >1, e.g. 1.5, preferably >2, e.g. 2.5. If the linear slope 128 above the laser threshold current does not meet the minimum expectation of a gradient of the linear slope 128, a malfunction of the laser diode 12 or 52 is likely. Thus, it is also sufficient to only calculate the gradient of the linear slope without calculating the gradient of the linear slope 126, and to detect a malfunction or degradation solely from the gradient of the linear slope 128 above the laser threshold current.

The determined alternative or virtual laser threshold current itself can be used as an indicator of a malfunction or degradation of the laser diode. For example, a malfunction or degradation of the laser diode may be detected if the alternative or virtual laser threshold current exceeds a predetermined limit.

Figure 7:
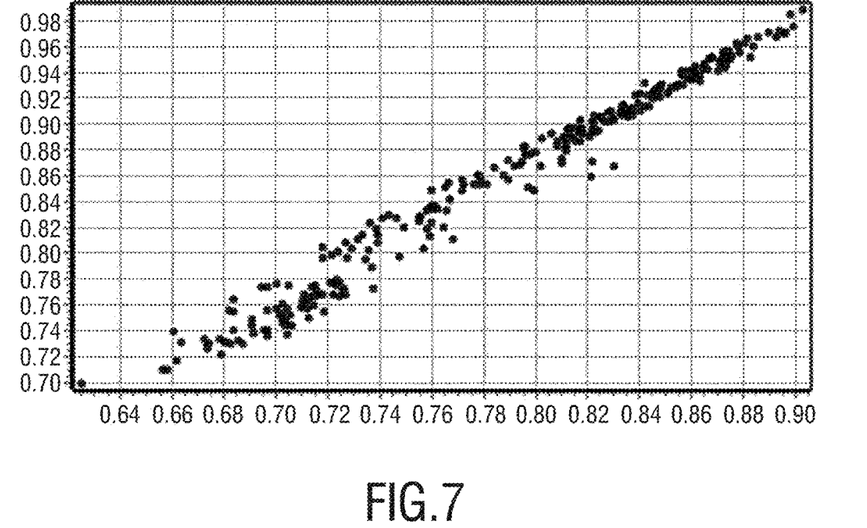
FIG. 7 shows a diagram illustrating the correlation between virtual laser threshold and threshold current obtained by measurements of optical output power of a plurality of laser diodes.

In any of the methods described above, the alternative laser threshold current Ith2 is a reliable measure for the actual or real laser threshold current and, thus, may give sufficient information on the quality state of the laser diode, without measuring the actual output power emitted by the laser diode. FIG. 7 shows the correlation between the alternative or virtual laser threshold current determined according to the principles (Y-axis) as described above and the real or actual laser threshold current measured by conventional output power measurements (X-axis) for a multitude of probed laser diodes. As can be seen, there is a good match between the determined alternative laser threshold current and the real or actual laser threshold current.

The alternative laser threshold current may be determined during operation of the laser device 10 or 50, or before the first use after manufacturing the laser diode 12 or 52 of the laser device 10 or 50.

Figure 8:
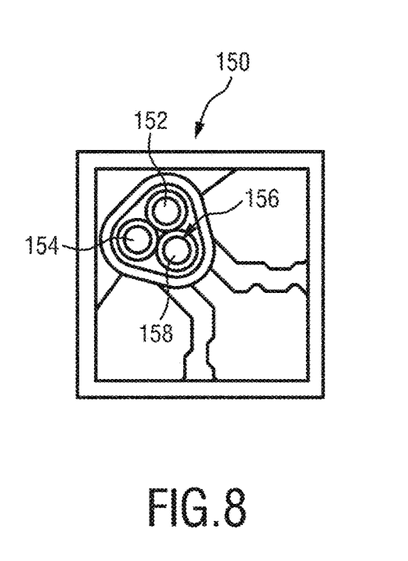
FIG. 8 shows a top view of another embodiment of a laser device comprising two laser diodes with one integrated photodiode.
Figure 9:
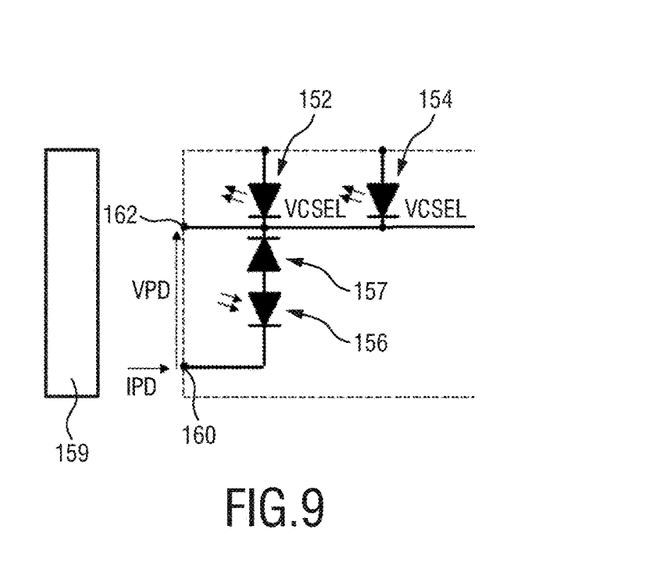
FIG. 9 shows a connection scheme of the connection between the two laser diodes and the photodiode.

With reference to FIGS. 8 and 9, a further embodiment of a laser device 150 will be described which makes use of the principles described above.

The laser device 150 comprises two laser diodes 152, 154 each configured as a VCSEL. Each VCSEL has a mesa structure as described with respect to FIGS. 1 and 2. The laser device 150 may also be denoted as a laser device having two mesas. The VCSELs 152, 154 are arranged on a common chip. The laser device 150 further comprises a single photodiode 156 an electric contact 158 of which can be seen in FIG. 8 only. The single photodiode 156 may be integrated into both laser diodes 152, 154 according to the embodiment of FIG. 1 (integrated into the laser diodes external to the resonator cavities) or according to FIG. 2 (integrated into the laser diodes 152, 154 within the resonator cavities). The photodiode receives radiation from both laser diodes 152, 154 individually.

FIG. 9 shows a connection scheme of the electrical connection between the two laser diodes 152, 154 and the photodiode 156. Circuitry 159 configured to control the laser diodes 152, 154 and the photodiode 156 and to measure photodiode currents in the photodiode 156 for a number of laser diode driving currents in the laser diodes 152, 154 is also provided. VPD denotes the photodiode voltage between the photodiode cathode 160 and a contact 162, the latter being on the same potential as the cathodes of the laser diodes 152, 154 and a cathode of an additional forward biased diode 157 which serves to contact the anode layer of the photodiode 156. IPD denotes the photodiode current which may be measured by the circuitry 159 in dependence on the radiation emitted by the laser diodes 152, 154 and received by the photodiode 156. It is to be understood that more than two laser diodes may be integrated in the laser device 150, while only one photodiode is sufficient also in this case.

The circuitry 159 is configured to determine the alternative laser threshold current for each of the laser diodes 152, 154 alternatingly by using the measured photodiode current of the one photodiode 156.

According to the principles of the present disclosure, the circuitry 159 may be configured to determine the alternative laser threshold current for each of the laser diodes 152, 154, for example from time to time, for example in intervals of one or more seconds. Thus, with one photodiode 156, the quality state of two laser diodes 152, 154 can be detected, by determining an alternative laser threshold current for each of the laser diodes 152 and 154. Depending on the quality state of the two laser diodes 152, 154, the alternative laser threshold current determined for the laser diode 152 may differ from the alternative laser threshold determined for the laser diode 154 or may be equal thereto. The circuitry 158 may use the calculated alternative laser threshold currents Ith2 of both of the laser diodes 152, 154 to determine, by comparison of the two alternative laser threshold currents, which one of the laser diodes 152 and 154 performs better than the other, and to select the better performing laser diode for use in a selected sensing application, for example for particle sensing. As already described above, when determining the alternative laser threshold current, it is advantageous to check whether a valid alternative laser threshold current has been determined, for example, by determining the ratio between the gradients of two linear slopes of photodiode currents below and above the laser threshold, and/or by determining whether Ith2 is below a predetermined limit. For example, if both laser diodes 152, 154 give a valid alternative laser threshold current Ith2, the laser diode with the lower Ith2 value is considered to be in superior condition and should be used. The other laser diode should not be used. If only one of the laser diodes 152, 154 has shown a valid "Ith2" result, this laser diode is the good one to be used in the application.

The circuitry 158 which performs the calculation of Ith2 may be implemented in an ASIC that drives and controls the laser diode chips.

In a method of monitoring an output power of a laser diode like laser diode 12; 52; 152, 156, a photodiode 20; 60; 156 is provided which is configured to receive radiation emitted by the laser diode 12; 52; 152, 156. The received radiation induces a photodiode current in the photodiode in dependence on the output power of the received radiation. The photodiode current is measured for a number of laser diode driving currents, and an alternative (virtual) laser threshold current of the laser diode is determined from the measured photodiode driving currents as a substitute of an actual laser threshold current of the laser diode.

While the subject matter of the present invention is advantageous for laser diodes with integrated photodiode or photodiodes, it can also be used for laser diodes with a photodiode external to the laser diode, wherein the laser diode and the photodiode may be integrated into a common housing.

While aspects of the present disclosure have been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

While subject matter of the present disclosure has been illustrated and described in detail in the drawings and foregoing description, such illustration and description are to be considered illustrative or exemplary and not restrictive. It will be understood that changes and modifications may be made by those of ordinary skill within the scope of the following claims. In particular, the invention defined by the following claims may cover further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A laser device, comprising
a laser diode configured to emit radiation, wherein an output power of the radiation is dependent on a laser diode driving current;
a photodiode configured to receive the radiation emitted by the laser diode, wherein a photodiode current induced in the photodiode by the received radiation is dependent on a power of the received radiations; and
circuitry configured to:
measure first photodiode current values for at least two first laser diode driving current values at which the laser diode is in a non-lasing operation,
calculate a first linear slope from the measured first photodiode current values,
measure second photodiode current values for at least two second laser diode driving current values at which the laser diode is in a lasing operation,
calculate a second linear slope from the measured second photodiode current values,
determine a calculated laser threshold current of the at least one laser diode as the laser diode driving current value at which the first and second linear slopes intersect,
determine a ratio of the gradient of the second linear slope to the gradient of the first linear slope, and detect a malfunction or degradation of the laser diode when the ratio is equal to or lower than a threshold.

2. The laser device of claim 1, wherein the circuitry is configured to detect the malfunction or degradation of the laser diode based on the calculated laser threshold current.

3. The laser device of claim 1, wherein the circuitry is configured to determine the calculated laser threshold current as the laser diode driving current at which the photodiode current as a function of the laser diode driving current exhibits a kink.

4. The laser device of claim 1, wherein the circuitry is configured to incrementally increase the laser diode driving current, to measure the photodiode current value for the incrementally increased laser diode driving current, and to determine the calculated laser threshold current as the laser diode driving current value at which the measured photodiode current value deviates from a linear slope by more than a threshold.

5. The laser device of claim 1, wherein the threshold is larger than 1.

6. The laser device of claim 2, wherein the circuitry is configured to detect a malfunction or degradation of the laser diode when the calculated laser threshold current exceeds a predetermined limit.

7. The laser device of claim 1, wherein the laser diode is a Vertical Cavity Surface Emitting Laser.

8. The laser device of claim 1, wherein the photodiode and the laser diode are arranged on a common chip.

9. The laser device of claim 1, wherein the photodiode is integrated in the laser diode and arranged external to an optical resonator of the laser diode.

10. The laser device of claim 1, wherein the photodiode is integrated in the laser diode and arranged internal to an optical resonator of the laser diode.

11. The laser device of claim 1, wherein the laser diode is a first laser diode, the laser device further comprising a second laser diode, wherein the photodiode is configured to receive the radiation emitted by the first laser diode and the radiation emitted by the second laser diode.

12. A method of monitoring an output power of a laser diode, the method comprising:
    providing a photodiode configured to receive radiation emitted by the laser diode, wherein the received radiation induces a photodiode current in the photodiode in dependence on the output power of the received radiation,
    measuring first photodiode current values for at least two first laser diode driving current values at which the laser diode is in a non-lasing operation,
    calculating a first linear slope from the measured first photodiode current values,
    measuring second photodiode current values for at least two second laser diode driving current values at which the laser diode is in a lasing operation,
    calculating a second linear slope from the measured second photodiode current values, and
    determining a calculated laser threshold current of the laser diode as the laser diode driving current value at which the first and second linear slopes intersect,
    determining a ratio of the gradient of the second linear slope to the gradient of the first linear slope, and
    detecting a malfunction or degradation of the at least one laser diode in response to the ratio being equal to or lower than a threshold.

13. A computer program having computer-executable program code, stored on a non-transitory computer readable medium, that, when executed by a computer, causes the computer to perform the method according to claim 12.

* * * * *